United States Patent [19]

Aoai et al.

[11] Patent Number: 4,983,491

[45] Date of Patent: Jan. 8, 1991

[54] PHOTOSENSITIVE DIAZO RESIN COMPOSITION WITH POLYURETHANE RESIN HAVING CARBOXYL GROUP IN ITS MAIN CHAIN

[75] Inventors: Toshiaki Aoai; Kazuo Maemoto; Akihiko Kamiya, all of Shizuoka, Japan

[73] Assignee: Fuji Photo Film Co., Ltd.

[21] Appl. No.: 412,544

[22] Filed: Sep. 22, 1989

Related U.S. Application Data

[63] Continuation of Ser. No. 132,237, Dec. 14, 1987, abandoned, which is a continuation-in-part of Ser. No. 934,574, Nov. 24, 1986, abandoned.

[30] Foreign Application Priority Data

Nov. 22, 1985 [JP] Japan .................. 60-263232
Nov. 22, 1985 [JP] Japan .................. 60-263233

[51] Int. Cl.$^5$ .................. G03F 7/021; G03C 1/60
[52] U.S. Cl. .................. 430/175; 430/157; 430/158; 430/176; 430/177; 430/171; 430/300; 430/302
[58] Field of Search .................. 430/175, 176, 906

[56] References Cited

U.S. PATENT DOCUMENTS

| | | | |
|---|---|---|---|
| 2,770,612 | 11/1956 | Schollenberger | 525/440 |
| 2,871,218 | 1/1959 | Schollenberger | 528/272 |
| 3,660,097 | 5/1972 | Mainthia | 430/176 |
| 4,186,017 | 1/1980 | Palmer | 430/175 |
| 4,289,838 | 9/1981 | Rowe et al. | 430/176 |
| 4,337,307 | 6/1982 | Neubauer | 430/906 |
| 4,467,027 | 8/1984 | Yamamoto et al. | 430/175 |
| 4,608,331 | 8/1986 | Bernstein et al. | 430/906 |
| 4,631,245 | 12/1986 | Pawlowski | 430/175 |
| 4,877,711 | 10/1989 | Aoai et al. | 430/175 |

FOREIGN PATENT DOCUMENTS 1024803  1/1978  Canada .................. 430/175

*Primary Examiner*—Charles L. Bowers, Jr.
*Attorney, Agent, or Firm*—Sughrue, Mion, Zinn, Macpeak & Seas

[57] ABSTRACT

A photosensitive composition is described, comprising a diazonium compound and a polyurethane resin having a carboxyl group in its main chain. The composition can be developed with an aqueous alkali developer to provide a lithographic printing plate having a long press life.

8 Claims, No Drawings

PHOTOSENSITIVE DIAZO RESIN COMPOSITION WITH POLYURETHANE RESIN HAVING CARBOXYL GROUP IN ITS MAIN CHAIN

This is a continuation of application Ser. No. 07/132,237, filed Dec. 14, 1987, abandoned, which is a continuation-in-part of application Ser. No. 06/934,574, filed Nov. 24, 1986, now abandoned.

FIELD OF THE INVENTION

This invention relates to a photosensitive composition and, more particularly, to a photosensitive composition which can be developed with an aqueous alkali developer and is useful for presensitized lithographic printing plate precursors to provide lithographic printing plates a long press life.

BACKGROUND OF THE INVENTION

Diazonium compounds are widely used as photosensitive materials for presensitized printing materials, and the most commonly employed are diazo resins typically exemplified by a formaldehyde condensate of p-diazodiphenylamine.

Compositions containing the diazo resins for forming a photosensitive layer of presensitized printing materials are classified into the type in which the diazo resin is used alone without using any binder as described, e.g., in U.S. Pat. No. 2,714,066 and the type in which the diazo resin is mixed with a binder as described, e.g., in Japanese Patent Application (OPI) No. 30604/75 (the term "OPI" as used herein means "unexamined published Japanese patent application"). In many of the latest presensitized printing plate precursors, the photosensitive layer comprises the diazonium compound and a polymeric binder to obtain the presensitized printing plate having long press life.

The photosensitive layer containing a polymer binder includes a so-called alkali development type in which unexposed areas are removed (developed) with an aqueous alkali developer and a so-called solvent development type in which unexposed areas are removed with an organic solvent type developer, and these types depend on the properties of the binder used. From the standpoint of safety and health of the working environment, the former alkali development type has lately attracted attention. Known methods of rendering binders alkali-developable include introduction of carboxylic acids into polymers by copolymerizing a carboxylic acid-containing comonomer as disclosed in Japanese Patent Application (OPI) No. 30604/75 or by reacting a hydroxyl group of polyvinyl alcohol with a cyclic acid anhydride, e.g., phthalic anhydride, as disclosed in U.S. Pat. No. 2,861,058. However, the polymers obtained by these methods exhibit poor abrasion resistance arising from their structure, and presensitized lithographic printing plate precursors containing such binders in the photosensitive layer only provide lithographic printing plates of low printing durability, i.e., short press life. On the other hand, polyvinyl acetal is disadvantageous in that it provides presensitized printing plate precursors of organic solvent development type only, though forming a tough and abrasion resistant film.

In addition, polyurethane resins are known to exhibit excellent abrasion resistance. Examples of application of polyurethane resins include a combination of a diazonium compound and a substantially linear polyurethane resin and a combination of a diazonium salt polycondensate and a branched polyurethane resin as described in U.S. Pat. No. 3,660,097 corresponding to Japanese Patent Publication No. 36961/74 and U.S. Pat. No. 4,337,307 corresponding to Japanese Patent Application (OPI) No. 94346/81. However, none of these polyurethane resins has an alkali-soluble group so that solubility in an aqueous alkali developer is insufficient in its nature. It has been, therefore, very difficult to carry out development without leaving some film undeveloped.

SUMMARY OF THE INVENTION

One object of this invention is to eliminate the above-described disadvantages associated with the conventional polymeric binders and to provide a novel photosensitive composition having excellent developability with an aqueous alkali developer and long press life.

As a result of extensive investigations, it has now been found that the above objects can be accomplished by using a novel photosensitive composition.

The present invention relates to a photosensitive composition containing one or more of a diazonium compound and one or more of a polyurethane resin having a carboxyl group in its main chain.

DETAILED DESCRIPTION OF THE INVENTION

The diazonium compounds which can be used in the present invention include those described in U.S. Pat. Nos. 3,867,147 and 2,632,703, etc., and, in particular, diazo resins typically including condensates between aromatic diazonium salts and, for example, active carbonyl-containing compounds, such as formaldehyde. Preferred examples of the diazo resins include hexafluorophosphates, tetrafluoroborates or phosphates of a condensate between p-diazodiphenyl-amine and formaldehyde or acetaldehyde. Sulfonates (e.g., p-toluenesulfonate, dodecylbenzenesulfonate, 2-methoxy-4-hydroxy-5-benzoylbenzenesulfonate, etc.), phosphinates (e.g., benzenephosphinate, etc.), hydroxyl-containing compound salts (e.g., 2,4-dihydroxybenzophenone salt) or organic carboxylic acid salts of a condensate between p-diazodiphenylamine and formaldehyde as described in U.S. Pat. No. 3,300,309 are also preferred.

In addition, a mesitylenesulfonate of a condensate between 3-methoxy-4-diazo-diphenylamine and 4,4'-bis-methoxy-methyl-diphenyl ether as disclosed in Japanese Patent Application (OPI) No. 27141/83 is also suitably used.

The content of the diazonium compound in the photosensitive composition is from 1 to 50% by weight, and preferably from 3 to 20% by weight. If necessary, these diazonium compounds may be used in combinations of two or more thereof.

Polyurethane resin contained in the above composition is selected from the group consisting of the following polyurethane resins (A) and (B):

(A) Polyurethane resin which is prepared by a reaction of at least one diol having a carboxyl group with at least one diisocyanate, the diol being represented by the following formulae (I) to (V).

(B) Polyurethane resin which is prepared by an incorporation of a cyano group, a hydroxy group and/or a moiety containing a cyan group and/or a hydroxyl group to the polyurethane resin (A).

As the diol used in preparing the above polyurethane (A), a diol having a carboxyl may be admixed with a diol having no carboxyl group.

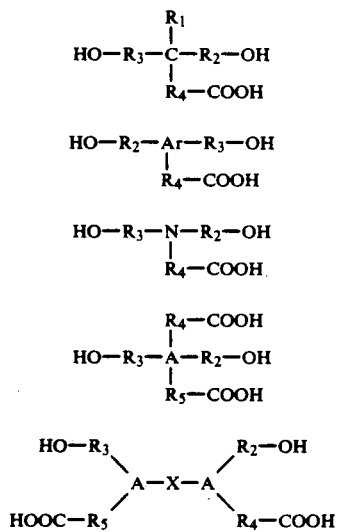

$$HO-R_3-\underset{\underset{R_4-COOH}{|}}{\overset{\overset{R_1}{|}}{C}}-R_2-OH \quad (I)$$

$$HO-R_2-\underset{\underset{R_4-COOH}{|}}{Ar}-R_3-OH \quad (II)$$

$$HO-R_3-\underset{\underset{R_4-COOH}{|}}{N}-R_2-OH \quad (III)$$

$$HO-R_3-\underset{\underset{R_5-COOH}{|}}{\overset{\overset{R_4-COOH}{|}}{A}}-R_2-OH \quad (IV)$$

$$\begin{array}{c} HO-R_3 \\ HOOC-R_5 \end{array} \!\!\!\!\!\diagdown A-X-A \diagup\!\!\!\!\! \begin{array}{c} R_2-OH \\ R_4-COOH \end{array} \quad (V)$$

wherein, $R_1$ represents a hydrogen atom, a substituted or unsubstituted alkyl group, a substituted or unsubstituted aralkyl group, a substituted or unsubstituted aryl group, a substituted or unsubstituted alkoxy group and a substituted or unsubstituted aryloxy group; $R_2$, $R_3$, $R_4$ and $R_5$, which may be the same or different each represents a single bond, a substituted or unsubstituted divalent aliphatic or aromatic residue, or a substituted or unsubstituted divalent aliphatic or aromatic residue having a

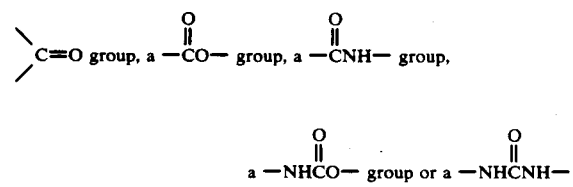

group at an end or trunk of the residue; Ar represents a substituted or unsubstituted trivalent aromatic residue; A represents a substituted or unsubstituted trivalent or more aliphatic or aromatic residue, a substituted or unsubstituted alicyclic residue or a substituted or unsubstituted hetero cyclic residue; X represents a >C=O group, a —SO₂ group, a single bond, a —O— group, a —S— group, a substituted or unsubstituted divalent aliphatic or aromatic group, or a substituted or unsubstituted divalent aliphatic or aromatic residue having an ester bond, an amido bond, a urethane bond, a ureido bond at an end or trunk of the residue.

Preferred $R_1$ represents a hydrogen atom, a substituted or unsubstituted alkyl group having from 1 to 8 carbon atoms, a substituted or unsubstituted aryl group having from 6 to 15 carbon atom. Preferred $R_2$, $R_3$, $R_4$ and $R_5$ each represents a single bond, a substituted or unsubstituted divalent aliphatic residue having from 1 to 20 carbon atoms, a substituted or unsubstituted divalent aromatic residue having from 6 to 15 carbon atoms, a substituted or unsubstituted divalent aliphatic or aromatic residue having 20 or less carbon atoms and having

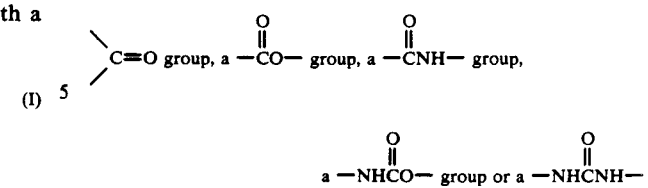

group at an end or trunk of the residue. Preferred Ar represents a substituted or unsubstituted aromatic residue having from 6 to 30 carbon atoms.

Preferred A represents a substituted or unsubstituted trivalent or more aliphatic, aromatic, alicyclic or heterocyclic residue having 30 or less carbon atoms. Preferred X represents a >C=O group, a —SO₂— group, a single bond, a —O— group, a —S— group, a substituted or unsubstituted aliphatic or aromatic residue having 15 or less carbon atoms or a substituted or unsubstituted divalent aliphatic or aromatic residue having 20 or less carbon atoms and having an ester bond, an amido bond, a urethane bond or a ureido bond at an end or trunk of the residue.

Preferable substituent described in the definition of groups $R_1$, $R_2$, $R_3$, $R_4$, $R_5$ and Ar, (A and X) includes a cyano group, a nitro group, a halogen atom (e.g., a fluorine atom, a chlorine atom, a bromine atom and an iodine atom), a —CONH₂ group, a —COOR₆ group, a OR₆ group, a —NHCONHR₆ group, a —NHCOOR₆ group, a —NHCOR₆ group, a —OCONHR₆ group, a —CONHR₆ group, etc., wherein R₆ represents an alkyl group having 1 to 10 carbon atoms, an aryl group having 6 to 10 carbon atoms, or an aralkyl group having 7 to 11 carbon atoms.

Preferable example of the diol having a carboxyl group includes 3,5-dihydroxybenzoic acid, 2,2-bis(hydroxymethyl) propionic acid, 2,2-bis(hydroxyethyl)propionic acid, 2,2-bis(3-hydroxypropyl)propionic acid, 2,2-bis(hydroxymethyl) acetic acid, bis(4-hydroxyphenyl)acetic acid, 4,4-bis(4-hydroxyphenyl)pentanoic acid, tartaric acid, 2,2-bis(hydroxymethyl)malonic acid, 2,2-bis(hydroxyethyl)maronic acid, 3,3-bis(hydroxymethyl)glutaric acid, 2,2-bis(4-hydroxyphenyl)maronic acid, N,N-bis(2-hydroxyethyl)-2-carboxyethylamide, N,N-bis(2-hydroxyethyl)-3-carboxypropioramide, N,N-bis(2-hydroxyethyl)glycin, etc., and a compound having two hydroxyl groups and two carboxyl groups which is a reaction product of cyclic acid anhydride having two cyclic acid anhydride skeletons in a molecule and an excess amount of diol.

Preferable examples of the cyclic acid anhydride include aromatic tetracarboxylic dianhydrides such as pyromellitic dianhydride, 3,3',4,4'-benzophenonetetracarboxylic dianhydride, 3,3',4,4'-diphenyltetracarboxylic dianhydride, 2,3,6,7-naphthalenetetracarboxylic dianhydride, 1,4,5,8-naphthalenetetracarboxylic dianhydride, 4,4'-sulfonyldiphthalic dianhydride, 2,2-bis(3,4-dicarboxyphenyl)propane dianhydride, bis(3,4-dicarboxyphenyl)ether dianhydride, hydroquinonediacetate-trimellitic anhydride adduct, diacetyldiamine-trimellitic anhydride adduct, etc.; alicyclic tetracarboxylic dianhydrides such as 5-(2,5-dioxotetrahydrofuryl)-3-methyl-3-cyclohexene-1, 2-dicarboxylic anhydride (Epichron B-4400, product of Dainippon Ink and Chemicals, Inc.), 1,2,3,4-cyclopentanetetracarboxylic dianhydride, 1,2,4,5-cyclohexanetetracarboxylic dianhydride, tetrahydrofurantetracarboxylic dianhydride, etc.; and aliphatic tetracarboxylic dianhydrides such as 1,2,3,4-butanetetracarboxylic dianhydride, 1,2,4,5-pentanetetracarboxylic dianhydride, etc.

Preferable examples of diol having no carboxyl group include ethylene glycol, diethylene glycol, triethylene glycol, tetraethylene glycol, propylene glycol, dipropylene glycol, polyethylene glycol, polypropylene glycol, neopentyl glycol, 1,3-butylene glycol, 1,6-hexanediol, 2-butene-1,4-diol, 2,2,4-trimethyl-1,3-pentanediol, 1,4-bis-β-hydroxyethoxycyclohexane, cyclohexanedimethanol, tricyclodecanedimethanol, hydrogenated bisphenol A, hydrogenated bisphenol F, an ethylene oxide adduce of bisphenol A, a propylene oxide adduct of bisphenol A, an ethylene oxide adduct of bisphenol F, a propylene oxide adduce of bisphenol F, an ethylene oxide adduct of hydrogenated bisphenol A, a propylene oxide adduct of hydrogenated bisphenol A, hydroquinone dihydroxyethyl ehter, p-xylylene glycol, dihydroxyethylsulfone, bis(2-hydroxyethyl)-2,4-tolylenedicarbamate, 2,4-tolylene-bis(2-hydroxyethyl-carbamide), bis(2-hydroxyethyl)-m-xylylenecarbamate, bis(2-hydroxyethyl)phthalate, etc.

Examples of diisocyanate include aromatic diisocyanate compounds, e.g., 2,4-tolylene diisocyanate or a dimer thereof, 2,6-tolylene diisocyanate, p-xylylene diisocyanate, metaxylylene diisocyanate, 4,4′-diphenylmethane diisocyanate, 1,5-naphthylene diisocyanate, 3,3′-dimethylbiphenyl-4,4′-diisocyanate, etc.; aliphatic diisocyanate compounds, e.g., hexamethylene diisocyanate, trimethylhexamethylene diisocyanate, etc.; alicyclic diisocyanate compounds, e.g., isophorone diisocyanate, 4,4′-methylenebis(cyclohexylisocyanate), methylcyclohexane-2,4 (or -2,6) diisocyanate, 1,3-(isocyanatomethyl)cyclohexane, etc.; diisocyanate compounds obtained by reacting diols and diisocyanates, e.g., an addition product of 1 mol of 1,3-butylene glycol and 2 mols of tolylene diisocyanate, etc.; and the like.

In preparing polyurethane resin A, a mixture of diol having a carboxyl group and diol having no carboxyl group is used to react with diisocyanate, wherein two kinds of diisocyanates may be used.

The polyurethane resins according to the present invention can be synthesized by heating the above-described diisocyanate compounds and diol compounds in an aprotic solvent in the presence of a known catalyst whose activity depends on the reactivity of each reactant. A preferred molar ratio of the diisocyanate compounds to diol compounds ranges from 0.8:1 to 1.2:1. When an isocyante group remains in the polymer terminals, the product is treated with alcohols, amines, etc., to ultimately produce a polymer containing no isocyanate group.

Polymethane (B) produced by introducing a residue including a cyan group and/or hydroxyl group to a polyurethane (A) by a polymerization reaction includes polyurethane obtained by reacting the above-described carboxyl-containing polyurethane resins A with a halogen compound having a hydroxyl group and/or a cyano group in the presence of a base to thereby replace a part of the carboxyl groups with a hydroxyl group and/or a cyano group. Introduction of a cyano group may also be effected by using a diol compound having a cyano group in combination with the diol compound of formula (II) or (III).

The polyurethane resins having a carboxyl group which can be used in the present invention, other than polyurethane resins above described may include those obtained by treating polyurethanes having carboxylate group with an acid. The polyurethanes having carboxylate group are prepared by reacting amines represented by formula (IV) with prepolymers having isocyanate end-groups as is described in Japanese Patent Publication No. 7720/71.

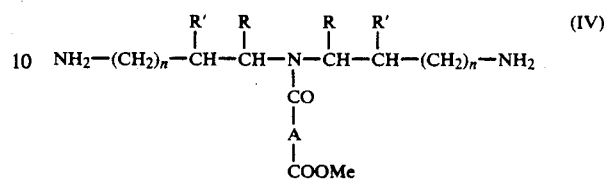

whrein R and R′ each represents a hydrogen atom, a lower alkyl group having from 1 to 6 carbon atoms, preferably a hydrogen atom or a methyl group; A represents —CH$_2$—CH$_2$—, —CH$_2$—CH$_2$—CH$_2$—,

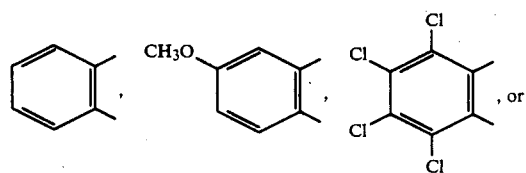

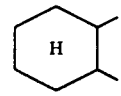

Me represents Li, Na, K, Rb,Cs, NH$_4$, NHR″$_3$, NH$_2$R″$_2$ or NH$_3$R″, wherein R″ represents an alkyl group having from 1 to 4 carbon atoms, and n represents an integer of 0 or 1.

Examples of such amines include those shown below.

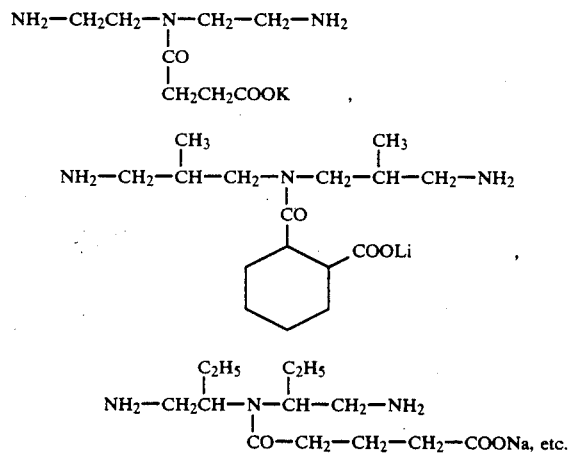

Preferable prepolymers having isocyanate endgroups are obtained by reacting an excessive amount of diisocyantes and diols. Preferable diisocyanate and diol include those used in the previous polyurethane preparation.

The polyurethane resins having a carboxyl group which can be used in the present invention may include those obtained by reacting polyurethanes having primary and/or secondary free hydroxyl group, and/or free amino group with a lactone having from 3 to 7 membered ring, an anhydride or epoxycarboxylic acid as is described in Japanese Patent Publication No. 24194/67. The above described polyurethanes composing a main chain are obtained by the reaction of compounds having two or more of active hydrogen atoms and polyisocyanates.

Preferable compounds having active hydrogen atoms include a polyester, a polyacetal, a polyether, a polythioether, a polyamide, a polyester, a polyesteramide, a conventional saturated or unsaturated glycol, e.g., an ethylene glycol, an ethylene glycol condensate, a butanediol, 1,2-propane diol, 1,3-propanediol, a neopentylglycol, a dioxyethoxyhydroquinone, a butenediol, a dioxyethyldiene, a monoor bis-alkoxylated aliphatic, alicyclic, aromatic, heterocyclic primary amine, e.g., N-methyldiethaneolamine, N-butyldiethanolamine, N,N-bis-Y-aminopropyl-N-methylamine, N-oleyldiethanolamine, N-cyclohexyldiisopropanolamine, N,N-dioxyethyl-p-toluidine, N,N-dioxypropylnaphthylamine, polyethoxylated N-butyldiehtanolamine, polypropoxylated N-methyldiehtanolamine (molecular weight 300 to 4,000), etc.

Examples of chain propagating agent include diethylenetriamine, triethylenetetramine, tetraethylenepentamine, pentaethylenehexamine, hexaethylenepentamine, etc.

Diisocyantes used in the above described reaction to provide polyurethane are the same as those described in the previous polyurethane preparation process.

Examples of acid anhydrides to provide carboxylic acid group include a succinic acid anhydride, a maleic acid anhydride, a phthalic acid anhydride, a di-, tetra-, and hexa-hydrophthalic acid anhydride etc. Examples of lactones include $\beta$-propiolactone, $\beta$-butyrolactone, etc. Examples of epoxycarboxylic acid include glycidic acid, etc.

The carboxyl group content in polyurethane in the above described composition is 0.4 meq/g or more, and more preferably 0.4 to 2.5 meq/g. If the content is lower than 0.4 meq/g, development is not carried out sufficiently and if 2.5 meq/g or over, image strength is degraded.

The polyurethane resins according to the present invention preferably have a weight average molecular weight more than 1,000, and more preferably of from 5,000 to 100,000.

These polyurethane resins may be used either individually or as a mixture of two or more thereof. The content of the polyurethane resin binder in the photosensitive composition ranges from about 50 to 99.5% by weight, and preerably from about 55 to 95% by weight.

The photosensitive composition of this invention can further contain resins other than the above-described polyurethane resins in amounts up to 50% by weight based on the polyurethane resins. Other resins which may be used include polyamide resins, epoxy resins, polyacetal resins, acrylic resins, methacrylic resins, polystyrene resins, novolak type phenolic resins, and the like.

If desired, the photosensitive composition of the invention may contain various additives for improving performance properties, such as dyes, pigments, stabilizers, fillers, surface active agents, plasticizers, and the like. For example, dyes to be used suitably include oil-soluble dyes, such as Oil Red RR (C.I. 26105), Oil Scarlet #308 (C.I. 21260), Oil Blue (C.I. 74350), Methylene Blue (C.I. 52015), Crystal Violet (C.I. 42555), Victoria Pure Blue (C.I. 42595), etc. Examples of stabilizers to be used include phosphoric acid, phosphorous acid, oxalic acid, p-toluenesulfonic acid, dipicolinic acid, malic acid, tartaric acid, 2-methoxy-4-hydroxy-5-benzoylbenzenesulfonic acid, butylnaphthalenesulfonic acid, p-hydroxybenzenesulfonic acid, etc.

The photosensitive composition according to the invention is usually dissolved in a solvent to form a coating composition, and the coating composition is coated on an appropriate support to a dry coating weight of from about 0.1 to 5 g/m$^2$, and preferably from 0.3 to 3 g/m$^2$, followed by drying.

Solvents to be used in the photosensitive coating composition include methanol, ethanol, isopropanol, n-butanol, t-butanol, 2-methoxyethanol, 1-methoxy-2-propanol, 2-ethoxyethanol, 2-methoxyethyl acetate, ethylene glycol, tetrahydrofuran, dioxane, dimethyl sulfoxide, N,N-dimethylformamide, acetone, methyl ethyl ketone, etc., and mixtures thereof.

Supports on which the photosensitive composition is applied include paper, plastic resin-laminated paper (e.g., paper laminated with polyethylene, polypropylene, polystyrene, etc.), metal plates (e.g., an aluminum (inclusive of aluminum alloys) plate, a zinc plate, a copper plate, etc.), plastic resin-films (e.g., films of cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal, etc.), paper or plastic resin-films on which the above-described metal is laminated or vacuum-deposited, and the like. Of these, an aluminum plate is particularly preferred because of its marked dimensional stability and low cost. A composite sheet composed of a polyethylene terephthalate film and an aluminum sheet thereon as described in Japanese Patent Publication No. 18327/73 is also preferably used.

When using a support having a metallic surface, particularly an aluminum surface, it is preferable that the support is subjected to surface treatment to render its surface hydrophilic, such as graining, dipping in an aqueous solution of sodium silicate, potassium fluorozirconate, a phosphoric acid salt, etc., anodic oxidation, and the like. For example, an aluminum plate having been dipped in a sodium silicate aqueous solution as described in U.S. Pat. No. 2,714,066, an aluminum plate having been anodically oxidized and then dipped in an alkali metal silicate aqueous solution as described in Japanese Patent Publication No. 5125/72, and an aluminum support having been subjected to a combination of mechanical graining and electrolytic graining as described in U.S. Pat. No. 4,476,006 can be advantageously. The above described anodic oxidation can be carried out by applying electric current to an aluminum plate as an anode in an electrolytic solution comprising one or more of aqueous or non-aqueous solutions of inorganic acids, e.g., phosphoric acid, chromic acid, sulfuric acid, boric acid, etc., organic acids, e.g., oxalic acid, sulfamic acid, etc., or salts of these acids.

After the graining or anodic oxidation, the support may preferably be subjected to sealing treatment by dipping in a sodium silicate aqueous solution, hot water or a hot aqueous solution of an inorganic or organic salt, or treating in a steam bath. Further, silicate electrodeposition as described in U.S. Pat. No. 3,658,662 is also effective as a surface treatment.

The photosensitive composition coated on the support is then exposed to light through a transparent original having a line or dot image and developed with an aqueous developer to provide a relief image negative to the original.

Light sources to be used for exposure include a carbon arc lamp, a mercury lamp, a xenon lamp, a tungsten lamp, a metal halide lamp. etc.

The photosensitive composition in accordance with the present invention is excellent in solubility in organic solvents for preparation of a coating composition and developability in the unexposed parts with an alkaline developer after imagewise exposure to light. The resulting relief image exhibits satisfactory abrasion resistance, oil sensitivity and adhesion to supports, and, when used as a printing plate, provides a large number of satisfactory prints.

The present invention will now be illustrated in greater detail with reference to Synthesis Examples and Examples, but it should be understood that these examples are not deemed to limit the present invention.

Unless otherwise specified, all ratios, percents, etc., are by wieght.

SYNTHESIS EXAMPLE 1

In a 500 ml-volume three necked flask were charged 125 g of 4,4'-diphenylmethane diisocyanate, 67 g of 2,2-bis(hydroxymethyl)propionic acid and 290 ml of dioxane to form a solution. One gram of N,N-diethylaniline was added thereto, and the mixture was stirred at reflux for 6 hours. After completion of the reaction, the reaction mixture was portionwise poured into a solution consisting of 4 liters of water and 40 ml of acetic acid to precipitate the polymer. Vacuum drying of the resulting solid gave 185 g of Polymer (A). Polymer (A) was found to have a carboxyl group content of 2.47 meq/g and a weight average molecular weight of 28,000 as determined by gel-permeation chromatography (polystyrene standard).

SYNTHESIS EXAMPLES 2 TO 17

In the same manner as in Synthesis Example 1, the diisocyanate compound and diol compound as shown in Table 1 were reacted to prepare Polymers (B) to (M). The carboxyl group content in each polymer is also shown in Table 1. Each of Polymers (B) to (Q) had a weight average molecular weight between 7,000 and 40,000 (polystyrene standard).

TABLE 1

| No. | Diisocyanate Compound | Diol Compound | Carboxyl Group Content (meq/g) |
|---|---|---|---|
| B | ![structure: 5-isocyanato-1-(isocyanatomethyl)-1,3,3-trimethylcyclohexane (IPDI)] | CH₃ \| HOCH₂—C—CH₂OH \| COOH | 2.44 |
| C | 3,3'-dimethyl-4,4'-diisocyanatobiphenyl | CH₂ \| HOCH₂—C—CH₂—OH \| COOH | 2.25 |
| D | OCN(CH₂)₆NCO | CH₃ \| HOCH₂—C—CH₂OH \| COOH | 3.07 |
| E | NCO/OCN(CH₂)₆NCO (70 mol %/30 mol %) diphenylmethane diisocyanate | CH₃ \| HO—CH₂—C—CH₂—OH \| COOH | 2.64 |
| F | m-xylylene diisocyanate | 5-hydroxyresorcinol-COOH (3,5-dihydroxybenzoic acid) | 2.11 |
| G | 1,5-naphthalene diisocyanate | 3,5-dihydroxybenzoic acid | 2.33 |

TABLE 1-continued

| No. | Diisocyanate Compound | Diol Compound | Carboxyl Group Content (meq/g) |
|---|---|---|---|
| H | 2,4-tolylene diisocyanate (OCN-C6H3(CH3)-NCO) | 2,2-bis(4-hydroxyphenyl)propionic acid derivative: HO-C6H4-C(CH3)(CH2-C6H4-OH)-CH2-COOH | 2.07 |
| I | 70 mol % 2,4-tolylene diisocyanate (with CH3) / 30 mol % OCN-(CH2)6-NCO (uretdione-type dimer shown) | 4-hydroxyphenyl-(4-hydroxyphenyl)(COOH)methane: HO-C6H4-CH(COOH)-C6H4-OH | 1.77 |
| J | 4,4′-diphenylmethane diisocyanate (OCN-C6H4-CH2-C6H4-NCO) | HOCH2-C(CH3)(COOH)-CH2OH / HO-(CH2)7-OH  60 mol %/40 mol % | 1.58 |
| K | 4,4′-diphenylmethane diisocyanate (OCN-C6H4-CH2-C6H4-NCO) | HOCH2-C(CH3)(COOH)-CH2OH / HO-C6H4-O-(CH2)2-OH  60 mol %/40 mol % | 1.46 |
| L | 70 mol % 4,4′-diphenylmethane diisocyanate / 30 mol % OCN-(CH2)6-NCO | HOCH2-C(CH3)(COOH)-CH2OH / HO-(CH2)2-O-(CH2)2-OH  60 mol %/40 mol % | 1.64 |
| M | 70 mol % 4,4′-diphenylmethane diisocyanate / 30 mol % OCN-(CH2)6-NCO | HOCH2-C(CH3)(COOH)-CH2OH / HO-(CH2)2-O-(CH2)2-O-(CH2)2-OH  60 mol %/40 mol % | 1.56 |

SYNTHESIS EXAMPLE 18

Forty grams of Polymer (A) as prepared in Synthesis Example 1 and 200 ml of dimethylformamide were charged in a 300 ml-volume round bottom flask equipped with a condenser and a stirrer to form a solution. To the solution was added 6.3 g (0.062 mol) of triethylamine. After heating the mixture to 80° C., 7.7 g (0.062 mol) of ethylene bromohydrin was added thereto dropwise over a period of 10 minutes with stirring. The stirring was continued for an additional two hours. After completion of the reaction, the reaction solution was poured into a solution consisting of 4 liters of water and 200 ml of acetic acid while stirring to precipitate a white polymer. The polymer was separated by filtration, washed with water and vacuum dried to obtain 42 g of Polymer (a).

NMR analysis of Polymer (a) revealed that a part of the carboxyl groups had been replaced with a hydroxylethyl group. The content of the remaining carboxyl group was determined by titration and was found to be 1.21 meq/g.

SYNTHESIS EXAMPLES 19 TO 35

Polyurethane polymers having a carboxyl group were prepared in the same manner as described in Synthesis Example 1 but using the diisocyanate compounds and diol compounds shown in Table 2. Each of the resulting polymers was reacted with ethylene bromohydrin (EBH) or ethylene cyanobromide (ECB) to obtain Polyurethane Polymers (b) to (n).

It was confirmed by NMR analysis that a hydroxyethyl group or a cyanoethyl group had been introduced in place of carboxyl group of the initial polyurethane resins. The resulting polymers were analyzed for molecular weight by gel-permeation chromatography and for remaining carboxyl group content by titration. The determined carboxyl group content is shown in Table 2.

TABLE 2
| Polyurethane No. | Diisocyanate Compound (mol %) | Diol Compound (mol %) | Remaining Carboxyl Group Content (meq/g) |
|---|---|---|---|
| (b) | OCN₋(CH₂)₆₋NCO (100) |  | 1.40 (EBH) |
| (c) | 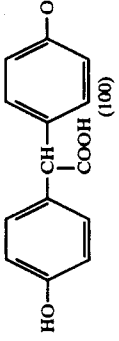 | 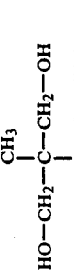 | 1.27 (ECB) |
| (d) | 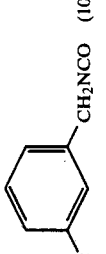 | 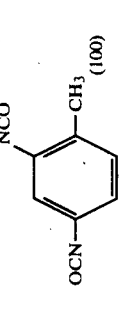 | 1.52 (EBH) |
| (e) | 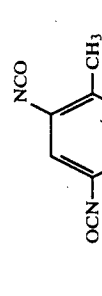 | 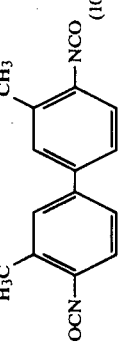 | 1.09 (ECB) |
| (f) | 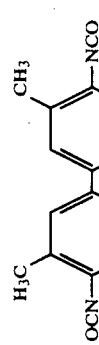 | 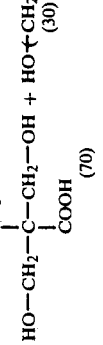 | 1.07 (EBH) |
| (g) | 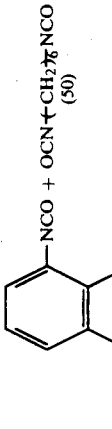 |  | 1.23 (ECB) |

TABLE 2-continued

| Polyurethane No. | Diisocyanate Compound (mol %) | Diol Compound (mol %) | Remaining Carboxyl Group Content (meq/g) |
|---|---|---|---|
| (h) | OCN–C₆H₃(CH₃)–N(CO)₂N–C₆H₃(CH₃)–NCO (50) + OCN(CH₂)₆NCO (50) | HO–CH₂–C(CH₃)(COOH)–CH₂–OH (70) + HO–CH₂–C(CH₃)₂–CH₂–OH (30) | 1.10 (EBH) |
| (i) | OCN–C₆H₄–CH₂–C₆H₄–NCO (60) + OCN(CH₂)₆NCO (40) | HO–CH₂–C(CH₃)(COOH)–CH₂–OH (100) | 1.20 (EBH) |
| (j) | OCN–C₆H₄–CH₂–C₆H₄–NCO (60) + OCN(CH₂)₆NCO (40) | HO–CH₂CH₂–C(CH₃)(COOH)–CH₂CH₂–OH (70) + HO–CH₂CH₂–SO₂–CH₂CH₂–OH (30) | 1.05 (EBH) |
| (k) | OCN–C₆H₄–CH₂–C₆H₄–NCO (40) + isophorone diisocyanate (60) | HO–C₆H₄–CH(COOH)–C₆H₄–OH (60) + HO(CH₂)₄OH (40) | 0.90 (EBH) |
| (l) | OCN–C₆H₄–CH₂–C₆H₄–NCO (70) + isophorone diisocyanate (30) | HO–CH₂–C(CH₃)(COOH)–CH₂–OH (100) | 1.25 (EBH) |
| (m) | OCN–C₆H₄–CH₂–C₆H₄–NCO (60) + OCN–C₆H₄–CH₂NHCO–C₆H₄–CH₂NCO (40) | C₆H₄(COO–CH₂CH₂–OH)₂ (30) + HO–CH₂–C(CH₃)(COOH)–CH₂–OH (70) | 1.18 (EBH) |

TABLE 2-continued

| Polyurethane No. | Diisocyanate Compound (mol %) | Diol Compound (mol %) | Remaining Carboxyl Group Content (meq/g) |
|---|---|---|---|
| (n) | H₃C–[biphenyl with CH₃]–NCO + OCN–(CH₂)₆–NCO (60)  (40) | HO–CH₂–C(CH₃)(COOH)–CH₂–OH (100) | 1.21 (EBH) |

EXAMPLE 1

A 0.24 mm thick aluminum sheet was grained with a nylon brush and an aqueous suspension of pumice having a particle size of 400 mesh and thoroughly washed with water. The grained surface was etched by dipping in a 10 wt % sodium hydroxide aqueous solution at 70° C. for 60 seconds, washed with running water, and neutralized with 20% nitric acid. The surface of the aluminum sheet was then subjected to electrochemical graining according to the description of Japanese Patent Application (OPI) No. 67507/78, i.e., in a 1 wt % nitric acid aqueous solution using an alternating wave current under electrolysis conditions of $V_A=12.7$ V, $V_C=9.1$ V and an anodic electric amount of 160 coulomb/dm$^2$. Subsequently, the sheet was desmutted by soaking in a 30 wt % sulfuric acid aqueous solution at 55° C. for 2 minutes. The sheet was then subjected to anodic oxidation in a 7 wt % sulfuric acid aqueous solution to form an aluminum oxide film of 2.0 g/m$^2$. The sheet was soaked in a 3 wt % sodium silicate aqueous solution at 70° C. for 1 minute, washed with water, and dried.

A photosensitive coating composition having the following formulation was coated on the thus prepared aluminum support to a dry coating weight of 2.0 g/m$^2$ by means of a wheeler, followed by drying at 80° C. for 2 minutes.

| Photosensitive Composition Formulation | |
| --- | --- |
| Dodecylbenzenesulfonate of a condensate between 4-diazodiphenylamine and formaldehyde | 0.5 g |
| Polyurethane resin of the invention (see Table 3) | 0.5 g |
| Oil-soluble dye (Victoria Pure Blue BOH) | 0.1 g |
| Phosphorous acid | 0.05 g |
| 2-Methoxyethanol | 100 g |

Each of the resulting presensitized printing plate precursors was imagewise exposed to light emitted from PS Light (produced by Fuji Photo Film Co., Ltd.) from a distance of 1 m for 1 minute and then dipped in a developer having the following formulation at room temperature for 1 minute. The unexposed area was removed by lightly rubbing the surface with absorbent cotton to obtain lithographic Printing Plates (I) to (X) having a bright blue image.

| Developer Formulation | |
| --- | --- |
| Sodium sulfite | 5 g |
| Benzyl alcohol | 30 g |
| Sodium carbonate | 5 g |
| Sodium isopropylnaphthalenesulfonate | 12 g |
| Water | 1000 ml |

For comparison, Lithographic Printing Plate (X) was produced in the same manner as described above, except for replacing the polymer of the present invention as used in the photosensitive coating composition with a polymer having the following repeating unit, wherein the a/b/c/d molar ratio was 35/30/25/10, and the weight average molecular weight was 65,000 (polystyrene standard):

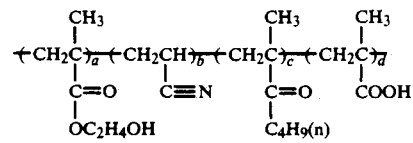

Each of Lithographic Printing Plates (I) to (X) was mounted on a printer "GTO" manufactured by Heidelberg Co., and printing was carried out on fine paper using a commercially available ink. There were obtained satisfactory prints as shown in Table 3.

TABLE 3

| Lithographic Printing Plate | Polymer Used | Press Life | Remark |
| --- | --- | --- | --- |
| (I) | Polyurethane (A) | 150,000 prints | Invention |
| (II) | Polyurethane (C) | 130,000 prints | Invention |
| (III) | Polyurethane (E) | 140,000 prints | Invention |
| (IV) | Polyurethane (F) | 150,000 prints | Invention |
| (V) | Polyurethane (J) | 170,000 prints | Invention |
| (VI) | Polyurethane (L) | 140,000 prints | Invention |
| (VII) | Polyurethane (N) | 180,000 | Invention |
| (VIII) | Polyurethane (O) | 170,000 | Invention |
| (IX) | Polyurethane (Q) | 180,000 | Invention |
| (X) | Comparative polymer | 100,000 prints | Comparison |

As can be seen from Table 3, Lithographic Printing Plates (I) to (IX) using the polyurethane resins according to the present invention are superior in printing press life to the comparative printing plate (X).

EXAMPLE 2

A photosensitive coating composition having the following formulation was coated on an aluminum support prepared in the same manner as in Example 1 to a dry coating weight of 2.0 g/m$^2$ by means of a wheeler, followed by drying at 80° C. for 2 minutes.

| Photosensitive Coating Composition Formulation | |
| --- | --- |
| 4-n-dodecylbenzenesulfonate of a condensate between 4-diazodiphenylamine and formaldehyde | 0.5 g |
| Polyurethane Resin of the invention (See Table 4) | 5.0 g |
| Oil-soluble dye (Victoria Pure Blue BOH) | 0.1 g |
| Malic acid | 0.05 g |
| 2-Methoxyethanol | 100 g |

Each of the resulting presensitized lithographic printing plate precursors was imagewise exposed to light and developed in the same manner as in Example 1 to obtain Lithographic Printing Plates (XI) to (XIX).

For comparison, Lithographic Printing Plate (XX) was produced in the same manner as described above, except for replacing the polyurethane resin of the present invention as used in the photosensitive coating composition with a polymer having the following repeating unit, wherein the a/b/c/d molar ratio was 9/24/58/9, and the weight average molecular weight was 55,000 (polystyrene standard):

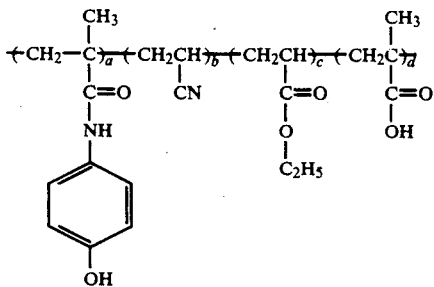

Each of the resulting lithographic printing plates was mounted on a printer "KOR" manufactured by Heidelberg Co., and printing was carried out on fine paper using a commercially available ink. There were obtained prints as shown in Table 4.

TABLE 4

| Lithographic Printing Plate | Polymer Used | Press Life | Remarks |
|---|---|---|---|
| (XI) | Polyurethane (a) | 180,000 prints | Invention |
| (XII) | Polyurethane (f) | 180,000 prints | Invention |
| (XIII) | Polyurethane (i) | 190,000 prints | Invention |
| (XIV) | Polyurethane (l) | 200,000 prints | Invention |
| (XV) | Polyurethane (n) | 190,000 prints | Invention |
| (XVI) | Polyurethane (o) | 200,000 prints | Invention |
| (XVII) | Polyurethane (p) | 210,000 prints | Invention |
| (XVIII) | Polyurethane (q) | 210,000 prints | Invention |
| (XIX) | Polyurethane (s) | 200,000 prints | Invention |
| (XX) | Comparative Polymer | 100,000 prints | Comparison |

It can be seen from Table 4 that the lithographic printing plates using the polyurethane resins according to the present invention are remarkably excellent in printing press life as compared with the comparative printing plate.

COMPARATIVE EXAMPLES

A photosensitive coating composition having the following formulation was coated in the same manner as Example 1.

| | | |
|---|---|---|
| Dodecylbenzenesulfonate of a condensate between 4-diazo diphenylamine and formaldehyde | 0.5 g | |
| Polyurethane resin (Table 5) | 5.0 g | |
| Victoria Pure Blue BOH | 0.1 g | |
| Mallecic Acid | 0.05 g | |
| MG | 100 g | |

Polyurethane used in the Comparative Examples are shown in Table 5.

TABLE 5

| No. | |
|---|---|
| (I') | Polyurethane (A) |
| (II') | Polyurethane (F) |
| (III') | Polyurethane (i) |
| (IV') | Polyurethane (m) |
| (V') | Polyurethane (Estane 5715) |

Each of the resulting presensitized printing plates thus obtained was imagewise exposed and developed in the same manner as Example 1. Lithographic Printing Plates (I') to (IV') were excellent in developability, but lithographic Printing Plate (V') had poor developability.

While the invention has been described in detail and with reference to specific embodiments thereof, it will be apparent to one skilled in the art that various changes and modifications can be made therein without departing from the spirit and scope thereof.

What is claimed is:

1. A photosensitive composition comprising one or more of a light-sensitive diazonium condensate resin in admixture with one or more of a polyurethane resin having a carboxyl group, wherein said diazonium condensate resin is contained in an amount of from 1 to 50 wt % based on a total composition, and said polyurethane resin is contained in an amount of from 50 to 99.5 wt % based on a total composition, and said polyurethane, having 0.90 to 3.07 meq/g of group content and is selected from the group consisting of the following polyurethane resins (A) and (B):

(A) Polyurethane resin which is prepared by a reaction of at least one diol having a carboxyl group with at least one diisocyanate compound, and (B) Polyurethane resin which is prepared by an incorporation of a moiety containing a cyano group and/or a hydroxyl group to the polyurethane resin (A), wherein said photosensitive composition, after coating on a support, imagewise exposure to light of the coating, and subsequent aqueous alkaline development of the coating, results in the formation of lithographic printing plate image.

2. A photosensitive composition as in claim 1, wherein said polyurethane resin has a hydroxyl group or a cyano group.

3. A photosensitive composition as in claim 1, wherein said polyurethane resin has a weight average molecular weight of from 5,000 to 100,000.

4. A photosensitive composition as in claim 1, wherein said diazonium condensate resin is present in an amount of from 3 to 20% by weight based on the composition.

5. A photosensitive composition as in claim 1, wherein said polyurethane resin is present in an amount of from about 55 to 95% by weight based on the composition.

6. A photosensitive composition as claimed in claim 1, wherein said diol having a carboxyl group is the following compound represented by formulae (I) to (V).

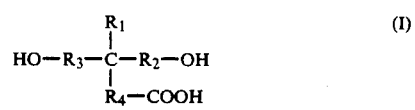

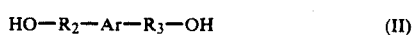

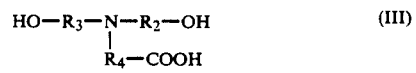

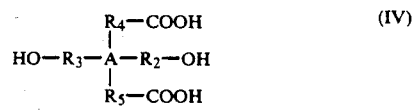

-continued

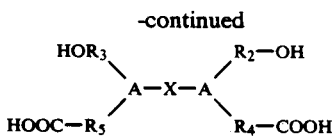
(V)

wherein, $R_1$ represents a hydrogen atom, a substituted or unsubstituted alkyl group, a substituted or unsubstituted aralkyl group, a substituted or unsubstituted aryl group, a substituted or unsubstituted alkoxy group and a substituted or unsubstituted aryloxy group; $R_2$, $R_3$, $R_4$ and $R_5$ which may be the same or different each represents a single bond, a substituted or unsubstituted divalent aliphatic or aromatic residue, or a substituted or unsubstituted divalent aliphatic or aromatic residue having a

group at an end or trunk of the residue; Ar represents a substituted or unsubstituted trivalent aromatic residue; A represents a substituted or unsubstituted trivalent or more aliphatic or aromatic residue, a substituted or unsubstituted alicyclic residue a substituted or unsubstituted heterocyclic residue; X represents a $>C=O$ group, a $-SO_2$ group, a single bond, a $-O-$ group, a $-S-$ group, a substituted or unsubstituted divalent aliphatic or aromatic group, or a substituted or unsubstituted divalent aliphatic or aromatic residue having an ester bond, an amido bond, a urethane bond, a ureido bond at an end or trunk of the residue.

7. A photosensitive composition as in claim 6, wherein a molar ratio of the diisocyanate compounds to the diol compounds is from 0.8:1 to 1.2:1.

8. A photosensitive composition as claimed in claim 6, wherein $R_1$ represents a hydrogen atom, a substituted or unsubstituted alkyl group having from 1 to 8 carbon atoms, a substituted or unsubstituted aryl group having from 6 to 15 carbon atoms; $R_2$, $R_3$, $R_4$ and $R_5$ each represents a single bond, a substituted or unsubstituted divalent aliphatic residue having from 1 to 20 carbon atoms, a substituted or unsubstituted divalent aromatic residue having from 6 to 15 carbon atoms, a substituted or unsubstituted divalent aliphatic or aromatic residue having 20 or less carbon atoms and having a

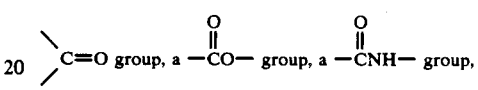

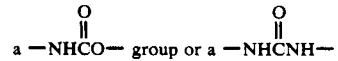

group at an end or trunk of the residue; Ar represents a substituted or unsubstituted trivalent aromatic residue having from 6 to 30 carbon atoms; A represents a substituted or unsubstituted trivalent or more aliphatic, aromatic, alicyclic or heterocyclic residue having 30 or less carbon atoms; X represents a $>C=O$ group, a $-SO_2-$ group, a single bond, a $-O-$ group, a $-S-$ group, a substituted or unsubstituted aliphatic or aromatic residue having 15 or less carbon atoms or a substituted or unsubstituted divalent aliphatic or aromatic residue having 20 or less carbon atoms and having an ester bond, an amido bond, a urethane bond or a ureido bond at an end or trunk of the residue.

* * * * *